(12) United States Patent
Sullivan et al.

(10) Patent No.: US 6,976,373 B1
(45) Date of Patent: *Dec. 20, 2005

(54) RINGLESS METER LOCK

(75) Inventors: Jeffrey R. Sullivan, Boston, NY (US); Eric R. Nolle, South Wales, NY (US)

(73) Assignee: McGard, LLC, Orchard Park, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/841,812

(22) Filed: May 8, 2004

Related U.S. Application Data

(63) Continuation of application No. 10/299,986, filed on Nov. 19, 2002, now Pat. No. 6,742,365.

(51) Int. Cl.[7] .............................................. E05B 65/48
(52) U.S. Cl. ..................... 70/2; 70/34; 70/56; 70/63; 70/159; 70/164; 70/451; 70/466; 292/281; 292/340
(58) Field of Search ....................... 70/2, 14, 63, 54–56, 70/158–173, 34, 386, 6–13, 232, 370, 371, 70/451, 466; 292/281, 282, 286, 340, DIG. 53; 248/551–553

(56) References Cited

U.S. PATENT DOCUMENTS

| | | | |
|---|---|---|---|
| 3,104,860 A | 9/1963 | Brittain ....................... | 248/552 |
| 4,080,811 A | 3/1978 | Nielsen, Jr. .................. | 70/164 |
| 4,096,718 A | 6/1978 | Michelman et al. ........... | 70/63 |
| 4,107,959 A | 8/1978 | Skarzynski et al. ........... | 70/159 |
| 4,152,910 A | 5/1979 | Swisher ........................ | 70/159 |
| 4,254,647 A | 3/1981 | Finck, Jr. ........................ | 70/77 |
| 4,414,829 A | 11/1983 | Nielsen et al. ................ | 70/160 |
| 4,986,096 A | 1/1991 | Soehner et al. ................ | 70/54 |
| 5,315,849 A | 5/1994 | Georgopoulos ................ | 70/24 |
| 6,439,010 B1 | 8/2002 | Julicher ....................... | 70/164 |
| 6,742,365 B1 * | 6/2004 | Sullivan et al. .................. | 70/2 |
| 6,763,691 B1 * | 7/2004 | Rafferty ....................... | 70/164 |

OTHER PUBLICATIONS

"Jiffy Lock for Ringless Meter Locks", http:/www.inner-tite.com/jiffylock/html (at least as early as Nov. 18, 2001).

* cited by examiner

*Primary Examiner*—Lloyd A. Gall
(74) *Attorney, Agent, or Firm*—Walter W. Duft

(57) ABSTRACT

A locking mechanism for securing the cover of a thin-walled box to the box frame. The locking mechanism includes a clip bracket adapted to engage a wall of the box frame, a lock body adapted to latch to the clip bracket and engage the box cover, a locking member carried by the clip bracket and adapted to clamp the clip bracket to the box wall when the locking member is in a clamping position, and a pivotable actuating lever adapted to actuate the locking member into the clamping position. The locking member and the actuating lever can be implemented as a two-piece system comprising first and second pivoting members. Alternatively, the locking member and the actuating lever can be integrally formed as a one-piece system. The locking mechanism is capable of multiple mounting positions on the box without drilling, and uses a spring-loaded plunger assembly that allows for a quick, keyless, slam installation.

21 Claims, 14 Drawing Sheets

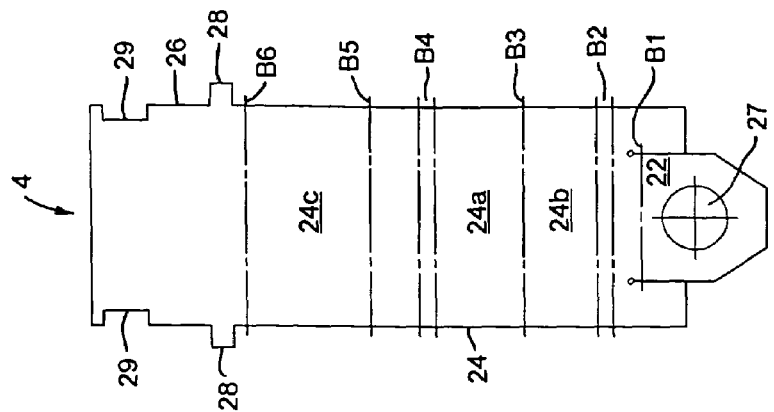
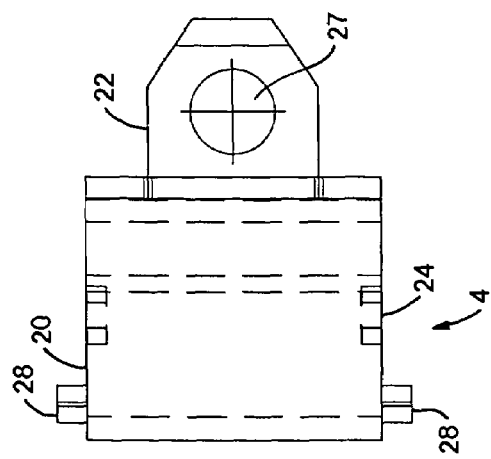
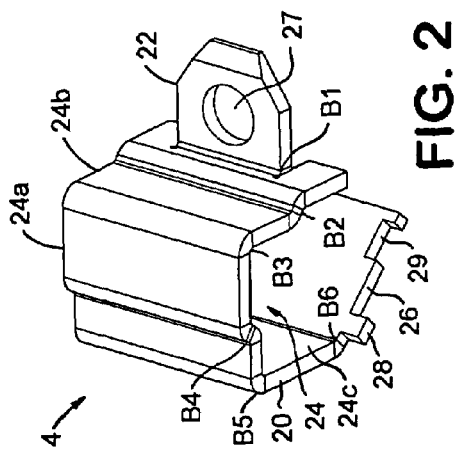
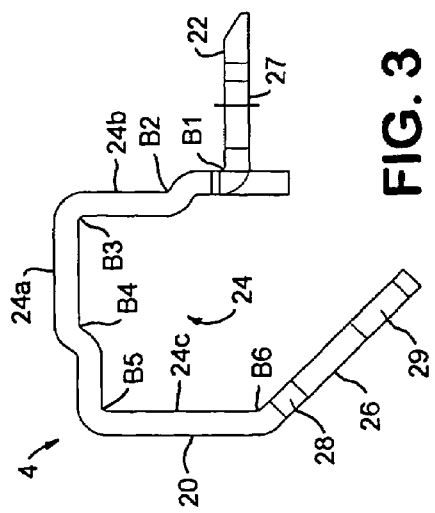

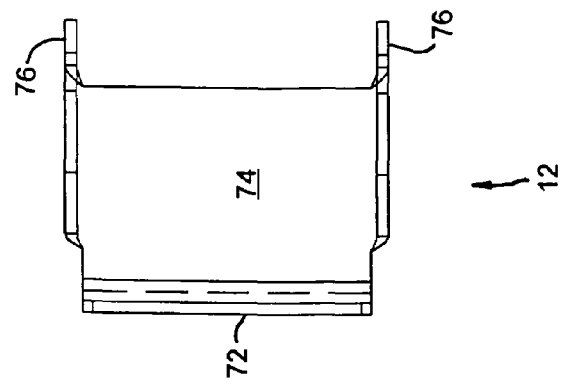
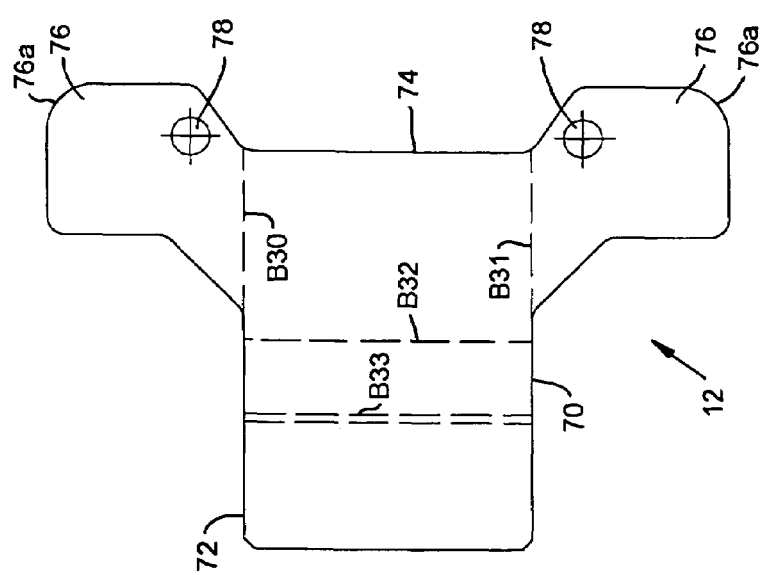
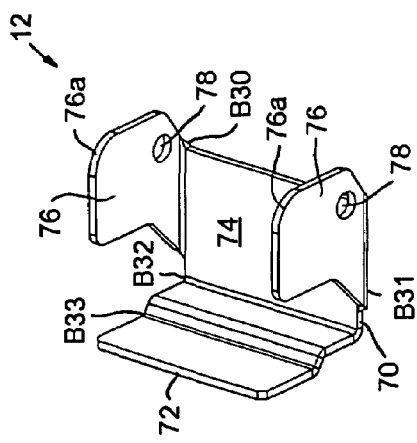
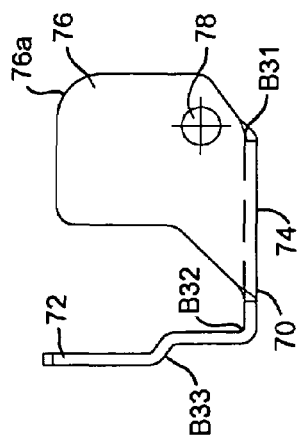

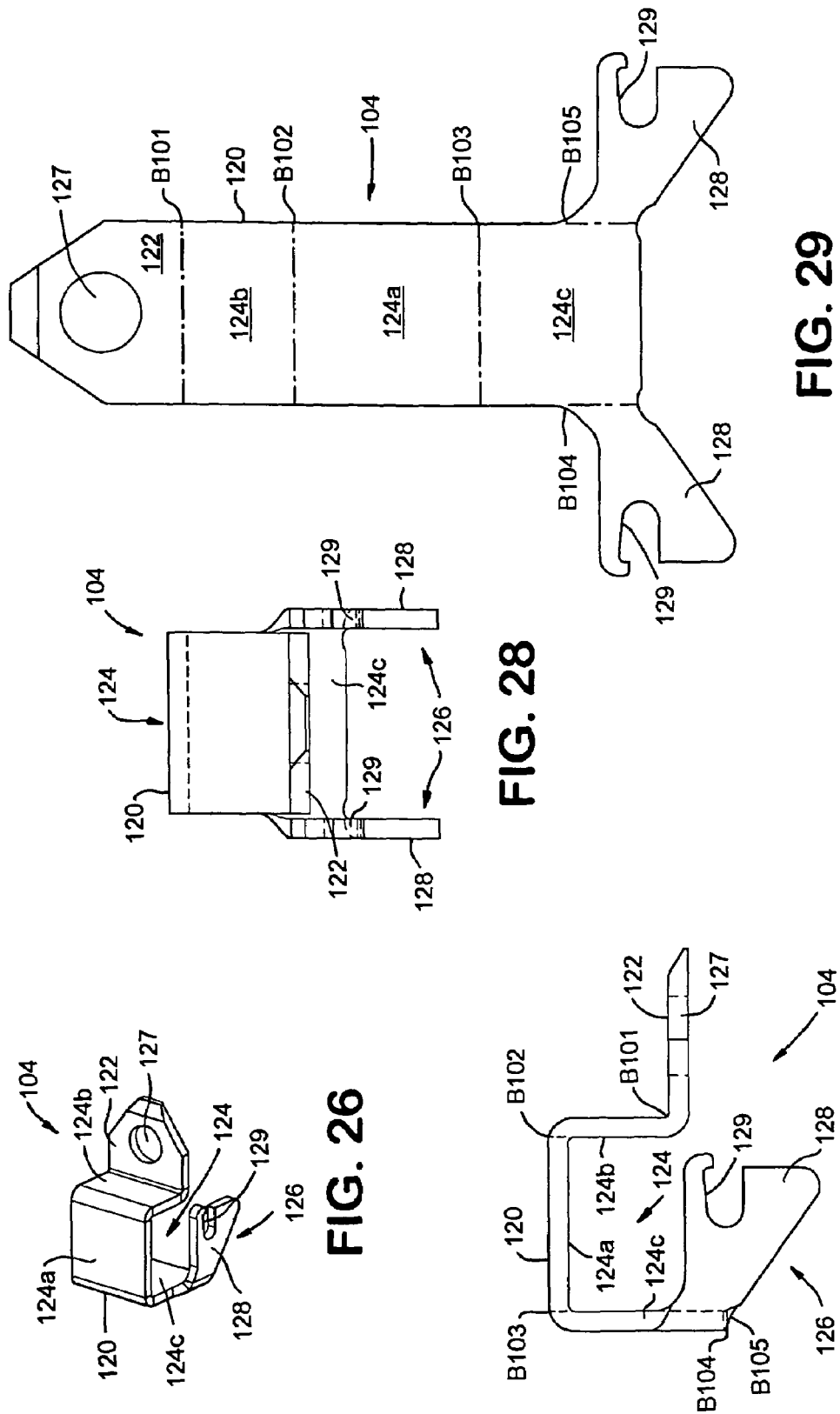

RINGLESS METER LOCK

CROSS-REFERENCE TO RELATED APPLICATIONS

This application is a continuation of U.S. patent application Ser. No. 10/299,986 filed Nov. 19, 2002 now U.S. Pat. No. 6,742,365 and entitled "Ringless Meter Lock."

STATEMENT REGARDING FEDERALLY SPONSORED RESEARCH OR DEVELOPMENT

Not Applicable

BACKGROUND OF THE INVENTION

1. Field of the Invention

This invention relates to a locking mechanism for securing the cover of a thin-walled box to a box frame. More particularly, the invention pertains to a lock for a ringless electrical meter box.

2. Description of the Prior Art

By way of background, utility companies provide and regulate power usage with the aide of metered fuse devices (meters). The meters allow power to run to individual customers and record the amount of power used by each customer. A typical electrical meter has rear electrical contact prongs that plug into electrical receptacles connected to a current transformer switch located inside a metal meter box that is situated individually or ganged with other meter boxes. In a ringless meter box, the meter is secured within the meter box by a hinged meter box cover having a flanged, circular opening through which the meter protrudes when the box cover is shut. The meter box prevents tampering with the meter and provides a means of disrupting or discontinuing service when necessary, whether for lack of payment by a customer or when service is no longer needed. This is done by removing the meter and covering the opening in the meter box cover, or by rotating the meter such that it does not contact the electrical receptacles, or by placing insulator plugs over the meter's electrical contact prongs. To prevent the reactivation of service by way of a replacement meter or a jumper placed across the meter box electrical receptacles, the meter box needs to be secured by tamper-proof means, such as a lock located on the exterior of the meter box, which prevents opening of the box cover. In addition, because of possible hostile conditions (e.g. dogs, disgruntled customers), service personnel should be able to secure the meter box as quickly as possible. Relatedly, it should be possible to mount the lock at different locations on the meter box even though the box wall profile differs from one location to the other. Presently, a variety of ringless meter box locks are used. Most need to be placed at predetermined positions, or require that a hole be drilled in the meter box. Others require the use of manually adjustable components and/or need keys and tools for installation. These locks are thus relatively time consuming to install. In addition, they may require that a hand be placed within a live box during installation.

SUMMARY OF THE INVENTION

The foregoing problems are solved and an advance in the art is obtained by a novel locking mechanism for securing the cover of a thin-walled box to a box frame. The locking mechanism comprises a clip bracket adapted to engage a wall of the box frame, a lock body adapted to latch to the clip bracket and engage the box cover, a locking member carried by the clip bracket and adapted to clamp the clip bracket to the box wall when the locking member is in a clamping position, and a pivotable actuating lever adapted to actuate the locking member into the clamping position.

The clip bracket can be configured with an outer catch portion adapted to extend outside the box frame and receive the lock body, an inner lever-carrying portion adapted to carry the locking member and the actuating lever within the box frame, and an intermediate throat portion interconnecting the catch portion and the lever-carrying portion. The throat portion is preferably sized to accommodate box walls having lips or flanges so that the locking mechanism can be mounted at the bottom of a ringless meter lock box (which typically has an inwardly extending lip or flange) as well as the sides thereof.

The lock body mounts a spring-loaded plunger lock assembly that is preferably configured for keyless slam-lock engagement with the catch portion of the clip bracket to facilitate quick installation. A slotted opening in the lock body receives the catch portion into engagement with the spring-loaded plunger lock assembly. The spring-loaded plunger lock assembly seats within the lock body in a manner that prevents removal of the plunger lock assembly by unauthorized means. A key configuration on the plunger lock assembly is provided for releasing the lock body from the clip bracket via a key. The key configuration is designed to prevent unauthorized release of the spring-loaded plunger lock assembly using a tool or device other than the key.

The locking member and the actuating lever can be implemented as a two-piece system comprising first and second pivoting members. Alternatively, the locking member and the actuating lever can be integrally formed as a one-piece system. In the two-piece implementation, the actuating lever is adapted to be manually pivoted into actuating engagement with the locking member prior to closure of the box cover. The actuating lever can be formed so that a cover-engaging portion thereof is trapped between the box cover and the clip bracket when the box cover is closed. This all but eliminates the possibility of the actuating lever being pivoted out of engagement with the locking member should an attempt be made to dislodge the locking mechanism by unauthorized means. The actuating lever also has a locking member-engaging portion, which can be implemented using a cam configuration, to contact a face of the locking member and urge it into the closed clamping position. Advantageously, the cam is shaped to retain the locking member in the clamping position irrespective of box frame orientation or box cover closure position. In the one-piece implementation, the actuating lever and the locking member pivot as a unit. The actuating lever is then preferably formed with a cover-engaging portion that is contacted by the box cover when it is closed. As this occurs, the actuating lever will be pivoted, thereby also pivoting the locking member into clamping engagement with the box wall. The cover-engaging portion of the actuating lever will also serve to convert any prying force on the locking mechanism or box cover into increased clamping force.

Advantageously, no drilling is required to install the locking mechanism. The clip bracket is simply placed over the box wall, the actuating lever is positioned as necessary, the box cover is closed, and the lock body is secured to the clip bracket.

BRIEF DESCRIPTION OF THE DRAWINGS

The foregoing and other features and advantages of the invention will be apparent from the following more particular description of preferred embodiments of the invention, as illustrated in the accompanying Drawings, in which:

FIG. 2 is a perspective view of a clip bracket of the locking mechanism of FIG. 1A;

FIG. 3 is a side elevational view of a clip bracket of the locking mechanism of FIG. 1A;

FIG. 4 is a plan view of a clip bracket of the locking mechanism of FIG. 1A;

FIG. 5 is a plan view of a shaped work piece prior to forming into a clip bracket of the locking mechanism of FIG. 1A;

FIG. 16 is a perspective view of an actuating lever of the locking mechanism of FIG. 1A;

FIG. 17 is a side view of an actuating lever of the locking mechanism of FIG. 1A;

FIG. 18 is a plan view of a shaped work piece prior to forming into an actuating lever of the locking mechanism of FIG. 1A;

FIG. 19 is a plan view of an actuating lever of the locking mechanism of FIG. 1A;

FIG. 26 is a perspective view of a clip bracket of the locking mechanism of FIG. 24;

FIG. 27 is a side elevational view of a clip bracket of the locking mechanism of FIG. 24;

FIG. 28 is a front view of a clip bracket of the locking mechanism of FIG. 24;

FIG. 29 is a plan view of a shaped work piece prior to forming into a clip bracket of the locking mechanism of FIG. 24;

FIG. 35 is a plan view of a spacer of the locking mechanism of FIG. 24a; and

FIG. 36 is a side view of a spacer of the locking mechanism of FIG. 24a.

DETAILED DESCRIPTION OF THE PREFERRED EMBODIMENTS

Figure 1A:
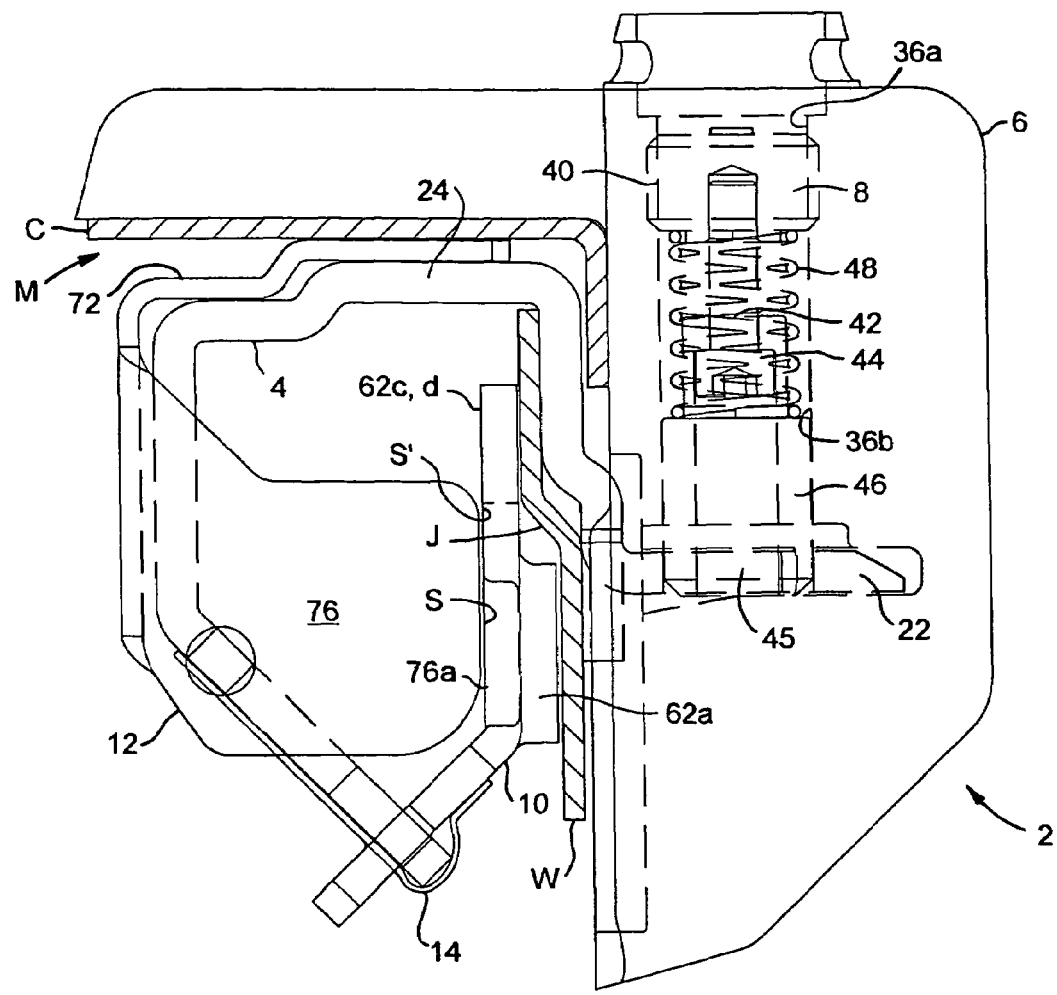
FIG. 1A is a side elevational view showing a locking mechanism constructed in accordance with a first exemplary embodiment of the invention, with a locking member thereof in a closed clamping position.

A locking mechanism for securing the cover of a thin-walled box to a box frame will now be described by way of exemplary embodiments shown by the drawing figures, in which like reference numerals indicate like elements in all of the several views.

1. First Exemplary Embodiment

Figure 1B:
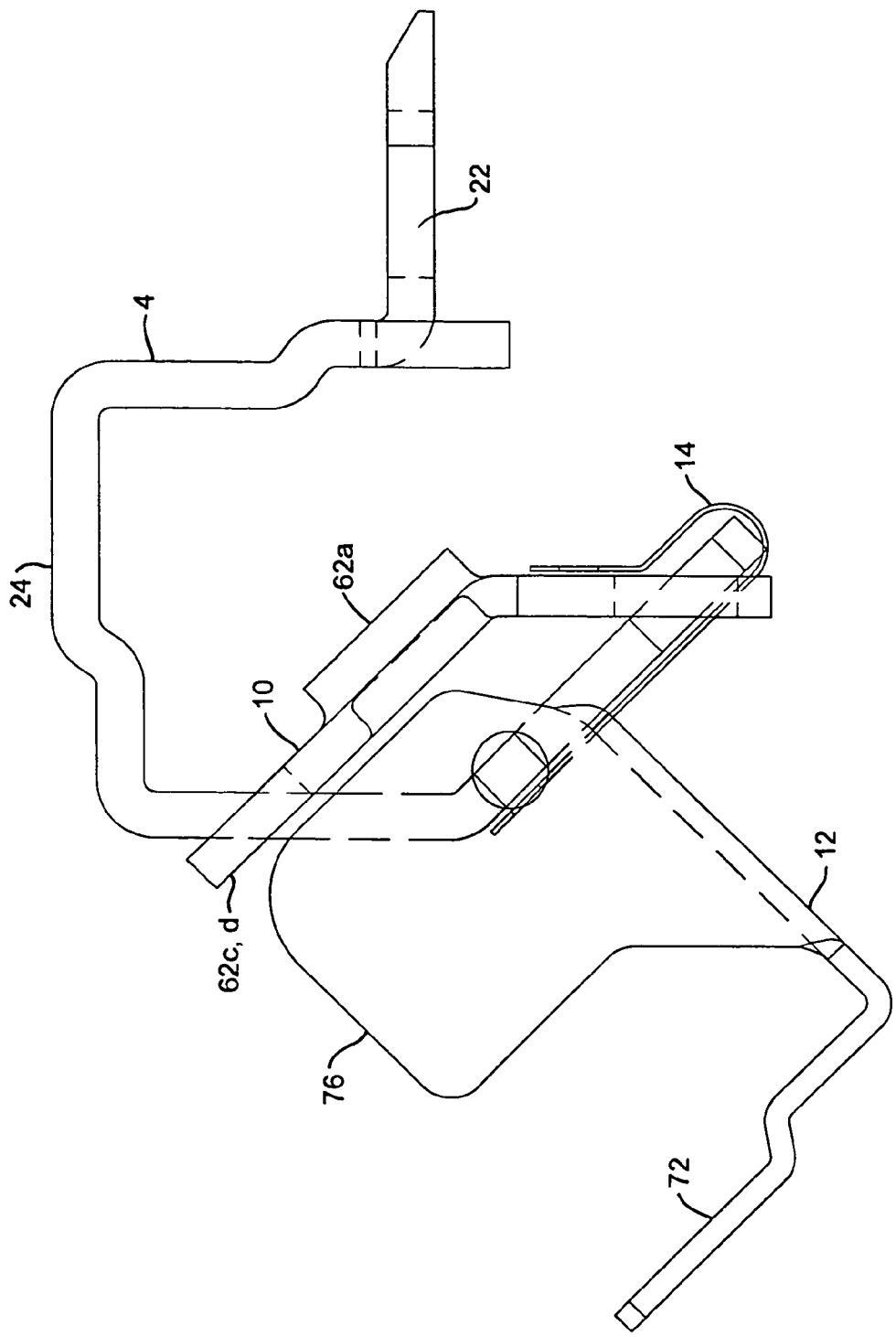
FIG. 1B is a side elevational view showing the locking mechanism of FIG. 1A with the locking member in an open unclamped position.
Figure 10:
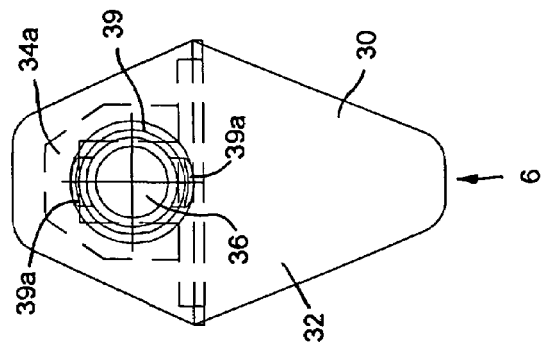
FIG. 10 is a plan view of a lock body of the locking mechanism of FIG. 1A.
Figure 8:
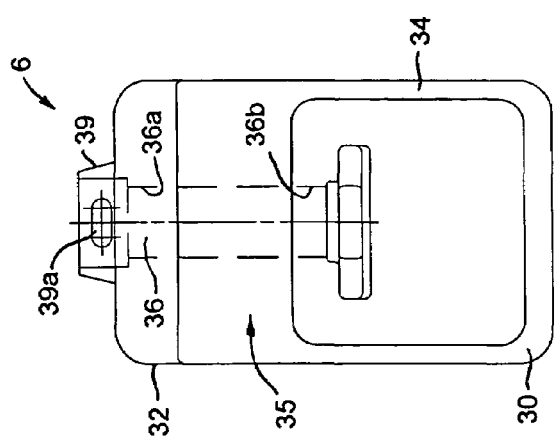
FIG. 8 is a front view of a lock body of the locking mechanism of FIG. 1A.
Figure 9:
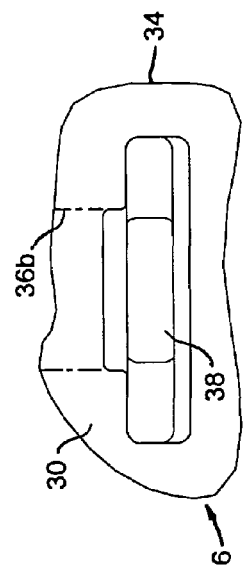
FIG. 9 is a fragmentary detailed front view of a lock body of the locking mechanism of FIG. 1A showing an insertion slot.
Figure 6:
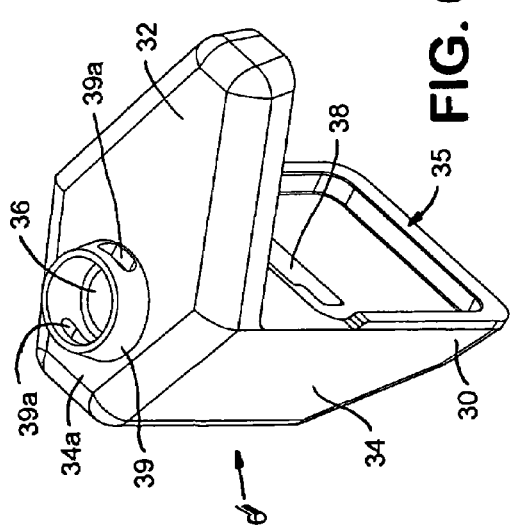
FIG. 6 is a perspective view of a lock body of the locking mechanism of FIG. 1A.
Figure 7:
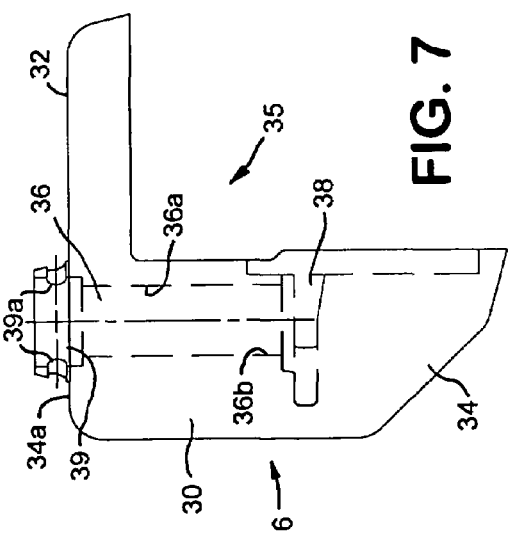
FIG. 7 is a side elevational view of a lock body of the locking mechanism of FIG. 1A.
Figure 11:
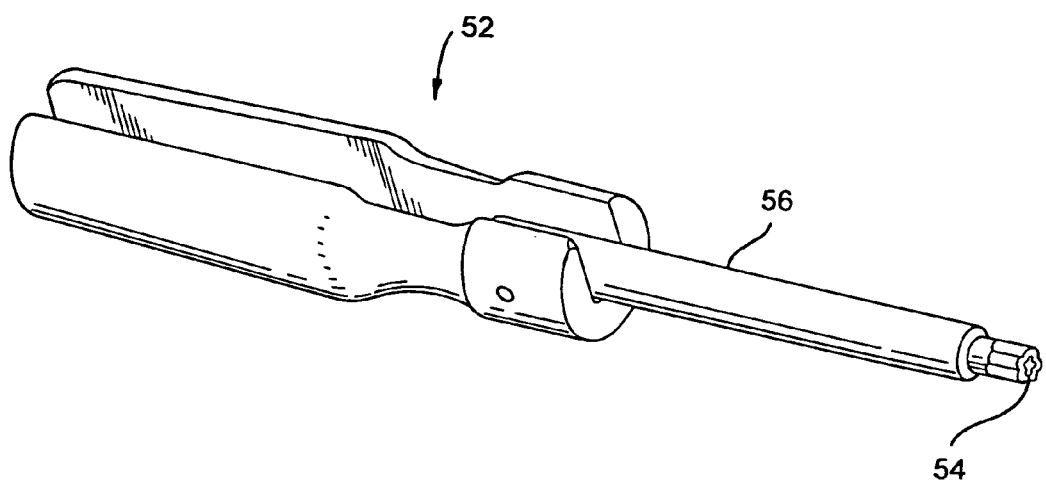
FIG. 11 is a perspective view of a key used to lock and unlock the locking mechanism of FIG. 1A.

A first exemplary embodiment of the invention will be described with reference to the locking mechanism 2 of FIGS. 1–23. As can be seen in the assembly views of FIGS. 1A and 1B, the locking mechanism 2 includes a clip bracket 4, a protective outer lock body 6 with a spring-loaded plunger lock assembly 8, a locking member 10, an actuating lever 12, and a spring 14. The clip bracket 4 is adapted to engage a wall W of a meter box M whose cover C is to be secured. The lock body 6 is adapted to latch to the clip bracket 4 and engage the box cover C, thereby securing the same. The locking member 10 and the actuating lever 12 are carried as first and second pivoting members on the clip bracket 4. The actuating lever 12 is adapted to actuate the locking member 10 so as to clamp the clip bracket 4 to the box wall W, following which the box cover C can be closed. This closed clamping position is illustrated in FIG. 1A. FIG. 1B shows an open unclamped position in which the locking member 10 and the actuating lever 12 are pivoted away from the clamping position under action of the spring 14.

Figure 20:
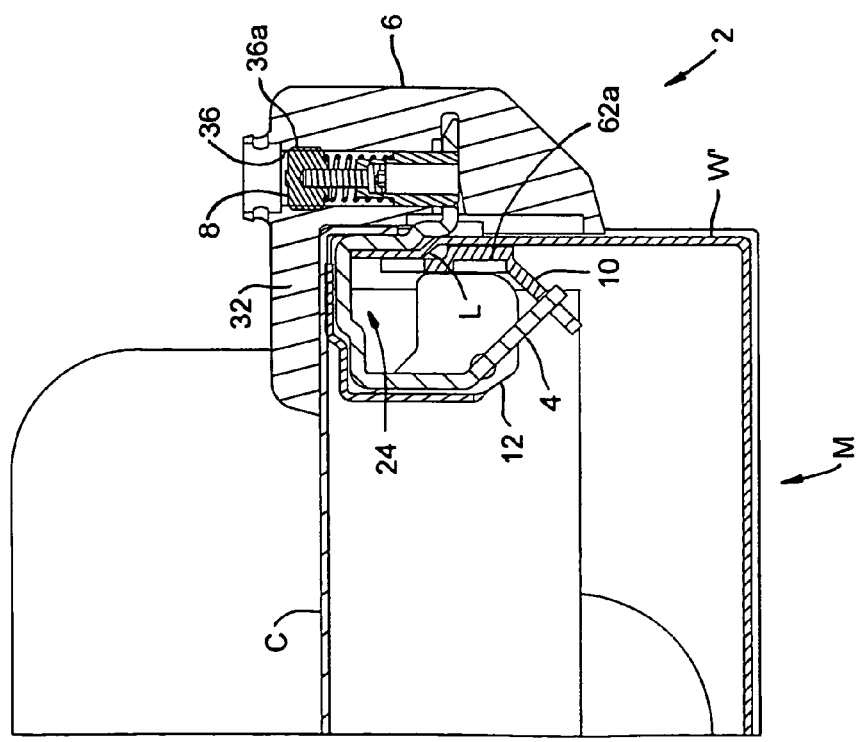
FIG. 20 is a cross-sectional view showing the locking mechanism of FIG. 1A mounted on the side of a ringless meter box.
Figure 22:
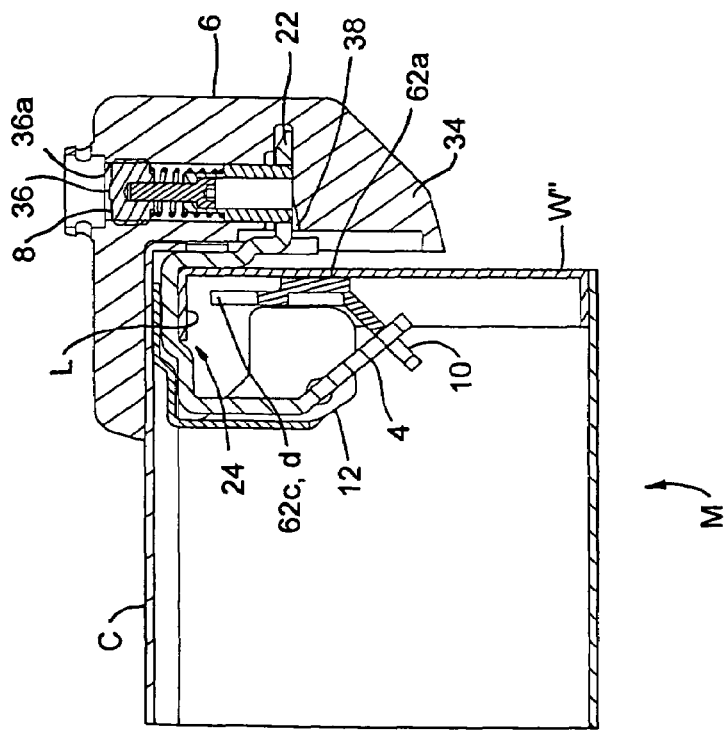
FIG. 22 is a cross-sectional view showing the locking mechanism of FIG. 1A mounted on the bottom of a ringless meter box.

In FIGS. 2–5, the clip bracket 4 is shown to be constructed as a singular body 20 made from a suitable metal, such as steel or the like. The body 20 is configured to provide an outer catch portion 22, an intermediate throat portion 24, and a lever-carrying portion 26. The catch portion 22 is adapted to engage a lateral opening of the lock body 6 (described below) and is preferably constructed with a tapered and chamfered end to facilitate guidance into the lock body lateral opening. Additionally, the catch portion 22 has a through-hole 27 proximate to its tapered end. The through-hole 27 is adapted to receive the spring-loaded plunger lock assembly 8 for locking purposes. The throat portion 24 includes a central throat section 24*a* adapted to rest on (and span) the wall W of the box M during use, an outer throat section 24*b* adapted to lie outside the wall W of the box M, and an inner throat section 24*c* adapted to lie within the box M. The dimensions of the throat portion 24 can be varied, and are selected such that the clip bracket 4 may accommodate thin-walled boxes with box walls of different width and height. Such walls may also have lips or flanges of various dimensions (see FIG. 22, showing an exemplary meter box bottom wall) or they may be formed without lips or flanges (see FIG. 20, showing an exemplary meter box side wall). The lever-carrying portion 26 is constructed with a pair of pivot tabs 28 and a pair of pivot slots 29. As described in more detail below, the pivot tabs 28 are adapted to receive the actuating lever 12, allowing the actuating lever 12 to pivot thereon. The pivot slots 29 are adapted to receive the locking member 10, allowing the locking member 10 to pivot therein.

As shown in FIG. 5, the clip bracket 4 can be formed from a single flat, stamped piece, and given its final configuration using a bending process. Other fabrication techniques, such as casting or molding, could also be used. During the bending process, the body 20 of the clip bracket 4 is bent at locations B3 and B5 at approximately 90-degree angles, creating the throat portion 24. The outer catch portion 22 is formed by separating and bending a central portion of the body 20 at B1. Two additional bends B2 and B4 of approximately 45 degrees are formed to respectively accommodate a jog in the box wall W and a jog in the actuating lever 12 (see FIG. 1A). A final bend B6 of approximately 45 degrees is formed to angle the lever carrying portion 26 at a desired orientation. Other bending configurations could also be used. For example, instead of a bend being approximately 90 degrees, two bends of approximately 45 degrees could be used, and so on.

The lock body 6 is shown in FIGS. 6–10 to be constructed as a singular block 30 made from any suitable material capable of withstanding tampering (e.g. hammering, sawing and prying), such as heat-treated or hardened steel or the like. Advantageously, the lock body 6 is configured to restrict gripping and hammering by having angled and radiused surfaces that eliminate purchase points. In particular, the surfaces of the lock body 6 are configured such that no two surfaces are mutually parallel, so that there are no exposed ninety-degree surface intersections, and so that all potential purchase points, especially those at the top of the lock body 6, are rounded. The block 30 is configured to define a lock tab portion 32 adapted to engage the box cover C, and a main body portion 34. The lock tab portion 32 and the main body portion 34 intersect at an angle of approximately 90 degrees to form a cut out region 35 that conforms to the exterior contour of the meter box M (see FIG. 1B). The lock tab portion 32 will thus engage the top of the box cover C during use, while the main body portion 34 will be oriented in adjacent facing relationship with the box wall W. The main body portion 34 has a longitudinally extending opening 36 and a laterally extending opening 38. The longitudinal opening 36 comprises a tapered internally threaded (tapped) bore 36*a* that extends from a surface 34*a* of the main body portion 34 for a distance sufficient to receive a lock assembly (see below), at which point it merges with a non-threaded, non-tapered bore 36*b* that extends to intersect with the lateral opening 38. The lateral opening 38 is generally slot shaped. It will be seen that the main body portion 34 of the lock body 6 has a protruding seal holder 39 coaxially formed around the longitudinal opening 36. The seal holder 39 is constructed with one or more openings 39*a* adapted to receive a wire-like seal identifying a service provider.

The longitudinal opening 36 of the lock body 6 is designed to receive a lock assembly that secures the lock body 6 to the clip bracket 4. The lock assembly may be of any suitable type, such as a barrel lock with a no-slam installation (not shown), or a key and tumbler lock allowing for a slam or no-slam installation (not shown). Preferably, however, the lock assembly is implemented using the above-referenced spring-loaded plunger lock assembly 8 that provides a novel slam-lock installation.

As best seen in FIG. 1A, the spring-loaded plunger lock assembly 8 has a threaded plug 40 that is threaded into the threaded tapered bore 36*a* of the lock body 6 until an interference fit is generated that produces a desired installation torque. This arrangement provides security against unauthorized removal of the spring-loaded plunger lock assembly 8 and disengagement of the lock body 6 from the clip bracket 4. A stem 42 extends from the threaded plug 40 and has a head 44 that is slidably received in the bore 45 of a latch head 46. A coil spring 48 biases the latch head 46 away from the threaded plug 40. When the spring-loaded plunger lock assembly 8 is introduced into the threaded bore 36*a*, the threaded plug 40 will reach its limit of downward movement by virtue of the aforementioned interference fit prior to reaching the non-threaded bore 36*b*. The coil spring 48 will bias the latch head 46 to the bottom surface of the lateral opening 38. Note that this arrangement accommodates tolerances within the longitudinal opening 36, insofar as the coil spring 48 will always bias the latch head 46 to its lowermost position.

As indicated above, the lateral opening 38 in the lock body 6 is slot shaped and adapted to accept the catch portion 22 of the clip bracket 4 when the lock body 6 is mounted thereon. During installation of the lock body 6, the catch portion 22 advances into the lateral opening 38 of the lock body 6 until the catch portion 22 contacts and pushes the latch head 46 upwardly. As the catch portion 22 continues to advance, the latch head 46 will become aligned with the through-hole 27 in the catch portion 22. At this point, the coil spring 48 biases the latch head 46 into the through-hole 27 so as to effect locking engagement with the catch portion 22.

Figure 12:
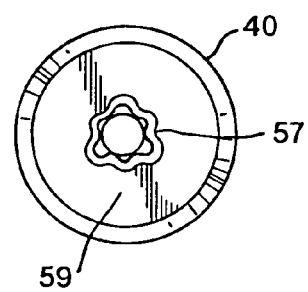
FIG. 12 is a top view of a spring-load plunger lock assembly of the locking mechanism of FIG. 1A.

The spring-loaded plunger lock assembly 8 is advanced or retracted relative to the lock body 6 by utilizing a key 52 (shown in FIG. 11) having a curvilinear ridge 54 at the end of a stem 56. The curvilinear ridge 54 is of a configuration to mate with a curvilinear groove 57 in the face 59 of the threaded plug 40 (as shown in FIG. 12). The curvilinear groove 57 is constructed with a relatively small pattern curvature and groove width such that no device or tool (e.g., a large-flat bladed screwdriver) other than the key 52 will be able to engage the groove 57 in such a manner as to develop enough torque to unseat the threaded plug 40 from the threaded bore 36*a* when the spring-loaded plunger lock assembly 8 is in its locked position at the desired installation torque.

Figure 13:
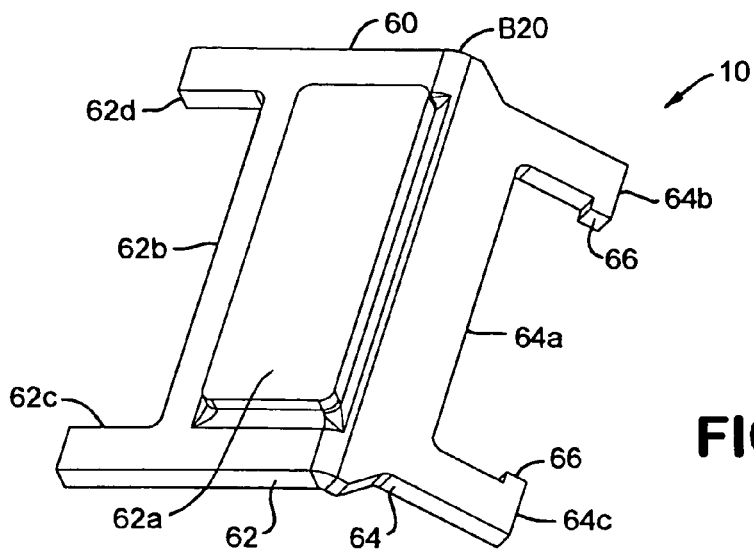
FIG. 13 is a perspective view of a locking member of the locking mechanism of FIG. 1A.
Figure 14:
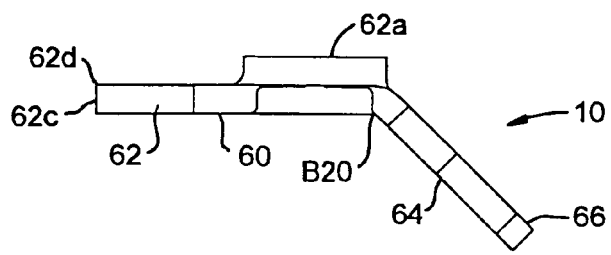
FIG. 14 is a side view of a locking member of the locking mechanism of FIG. 1A.
Figure 15:
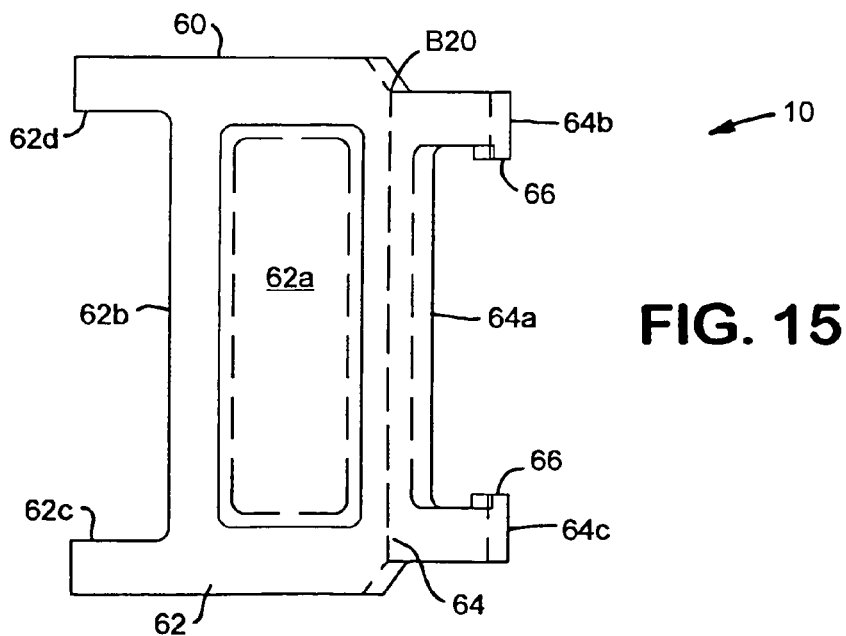
FIG. 15 is a plan view of a locking member of the locking mechanism of FIG. 1A.

Turning to FIGS. 13–15, the locking member 10 is shown to be constructed as a singular body 60 made from a suitable metal, such as steel or the like. A conventional casting or forging method may be used to form the locking member 10. Alternatively, a multiple element construction could be used. The body 60 is configured to provide a clamping portion 62 and a pivot portion 64. The clamping portion 62 is formed with a raised contact pad 62*a* adapted to engage the box wall W. By maintaining an angle B20 of approximately 45-degrees between the clamping portion 62 and the pivot portion 64, the face of the contact pad 62a will be substantially parallel to the box wall W when the locking member 10 is in its closed clamping position. It will be seen that the clamping portion divides at 62b into a pair of tabs 62c and 62d. As described in more detail below, the tabs 62c and 62d are adapted to engage the underside of a lip or flange L that is typically present on the bottom wall of a meter box (see FIG. 22). The tabs 62c and 62d are separated from each other in order to avoid interference with the clip bracket 4 when the locking member 10 is in the open unclamped position of FIG. 1B.

The pivot portion 64 of the locking member 10 is used to pivotally mount the locking member to the clip bracket 4. It divides at 64a into two arms 64b and 64c that engage the pivot slots 29 in the clip bracket 4 and provide a fulcrum or pivot point for the locking member 10. The arms 64b and 64c are configured with inwardly protruding support tabs 66 that help secure the locking member 10 to the clip bracket 4. As shown in FIGS. 1A and 1B, the spring 14 is provided at the locking member pivot point to urge the locking member 10 (and the actuating lever 12) into the open unclamped position shown in FIG. 1B.

The actuating lever 12 is shown in FIGS. 16–19 to be constructed as a singular body 70 made from a suitable metal, such as steel or the like. The body 70 is configured to provide a cover-engaging portion 72 and a pivot portion 74. The cover-engaging portion 72 is adapted to seat on the outside of the throat portion 24 of the clip bracket 4 when the locking mechanism 2 is in the closed clamping position of FIG. 1A. In this position, the cover-engaging portion 72 will also engage the box cover C and be trapped between the box cover and the clip bracket 4. The pivot portion 74 is constructed with a pair of locking member-actuating tabs 76 extending therefrom. The tabs 76 are formed with pivot holes 78 that are adapted to receive the pivot tabs 28 on the clip bracket 4, allowing the actuating lever 12 to pivot thereon. The tabs 76 also have cam edges 76a that are adapted to engage the locking member 10 as the actuating lever 12 is pivoted from the open unclamped position of FIG. 1B to the closed clamping position of FIG. 1A.

As shown in FIG. 18, the actuating lever 12 can be formed from a single flat, stamped piece, and given its final configuration using a bending process. Other fabrication techniques, such as casting or molding, could also be used. During the bending process, the body 70 of the actuating lever 12 is bent at locations B30 and B31 at approximately 90-degree angles, creating the tabs 76 of the pivot portion 74. An additional bend B32 of approximately 90-degrees is formed to create the cover-engaging portion 72. An approximately 45-degree bend B33 is also formed within the cover-engaging portion 72 so as to allow the cover-engaging portion to accommodate a similar bend configuration B4 (see FIG. 3) formed on the central throat section 24a of the clip bracket 4. Other bending configurations could be used. For example, instead of a bend being approximately 90 degrees, two bends of approximately 45 degrees could be used, and so on.

The operation of the locking mechanism 2 will now be described in detail with reference to FIGS. 1A and 1B. The locking mechanism 2 can be secured on the meter box M in two quick steps, without the use of a key. First, the clip bracket 4 carrying the locking member 10 and the actuating lever 12 in the open unclamped position of FIG. 1B is placed on the wall W of the meter box M, such that the outer catch portion 22 of the clip bracket 4 lies outside the meter box, and the wall of the meter box is spanned by the throat portion 24 of the clip bracket 4. The spring 14 will maintain the locking member 10 and the actuating lever 12 in the desired position during this installation. Otherwise, manual positioning of the locking member 10 and the actuating lever 12 would be required.

Figure 21:
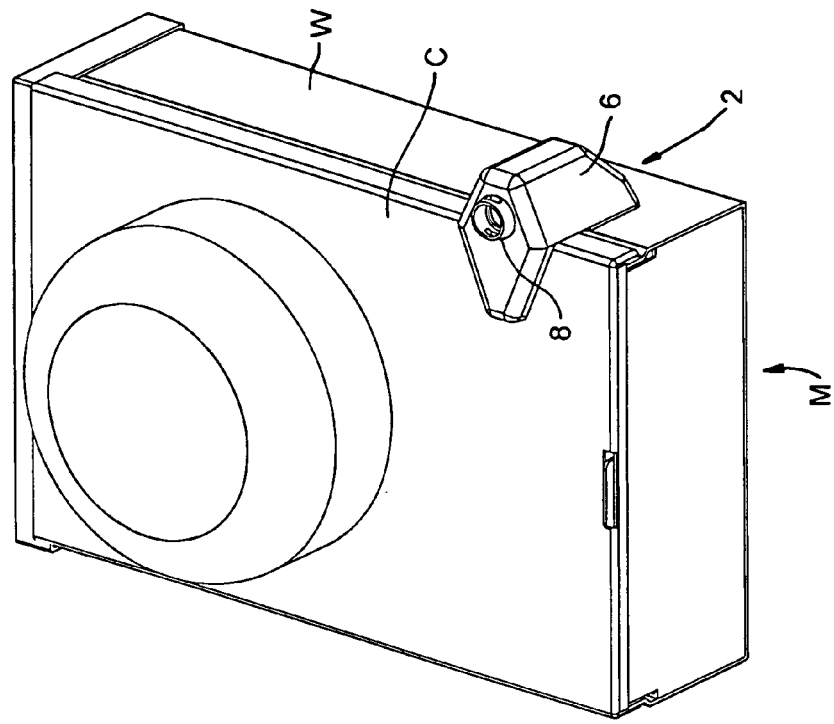
FIG. 21 is a perspective view showing the locking mechanism of FIG. 1A mounted on the side of a ringless meter box.

To effect clamping of the locking member 10, the actuating lever 12 is pivoted until its cover-engaging portion 72 is seated on the throat portion 24 of the clip bracket 4, as shown in FIG. 1A. As the actuating lever 12 is pivoted, the cam edges 76a of the tabs 76 will actuate the locking member 10 and force the contact pad 62a against the wall W of the meter box. Note that this operation does not require closure of the box cover C. Thus, as shown in FIGS. 20 and 21, the locking mechanism 2 can be easily installed on the side walls of the meter box M, and will be retained in position during closure of the box cover C, even when the box is mounted in the standard vertical orientation. To assist this "zero gravity" installation capability, the cam edges 76a of the actuating lever have a flat surface portion S that presses against a corresponding flat surface portion S' on the back of the locking member 10, in generally coplanar relationship therewith, when the latter is in the closed clamping position of FIG. 1A.

At this point, the box cover C can be closed. As shown in FIG. 1A, and as mentioned above, the cover engaging portion 72 of the actuating lever 12 will now be trapped between the box cover C and the throat portion 24 of the clip bracket 4. This will all but eliminate the possibility of the actuating lever 12 being pivoted out of engagement with the locking member 10 should an attempt be made to dislodge the locking mechanism by unauthorized means. It will also be seen in FIG. 1A that the contact pad 62a will be captured beneath an inwardly extending jog J in the wall W that conventionally extends along the sides of the meter box M. This will further help prevent the locking mechanism 2 from being removed by unauthorized means.

Following closure of the cover C, the lock body 6, with the spring-loaded plunger lock assembly 8 seated therein in a self-locking position at the desired installation torque, is positioned over the meter box M. The lateral opening 38 will be aligned with the outer catch portion 22 of the clip bracket 4. The main body portion 34 of the lock body 6 is then pushed toward the meter box M until the spring-loaded plunger lock assembly 8 slides through the opening 27 in the catch portion 22 of the clip bracket 4 in the manner described above. This will secure the lock body 6 to the clip bracket 4 and further secure the cover C of the meter box M by virtue of the lock tab portion 32 of the lock body 6 engaging the box cover C and the main body portion 34 of the lock body engaging the box wall W.

Figure 23:
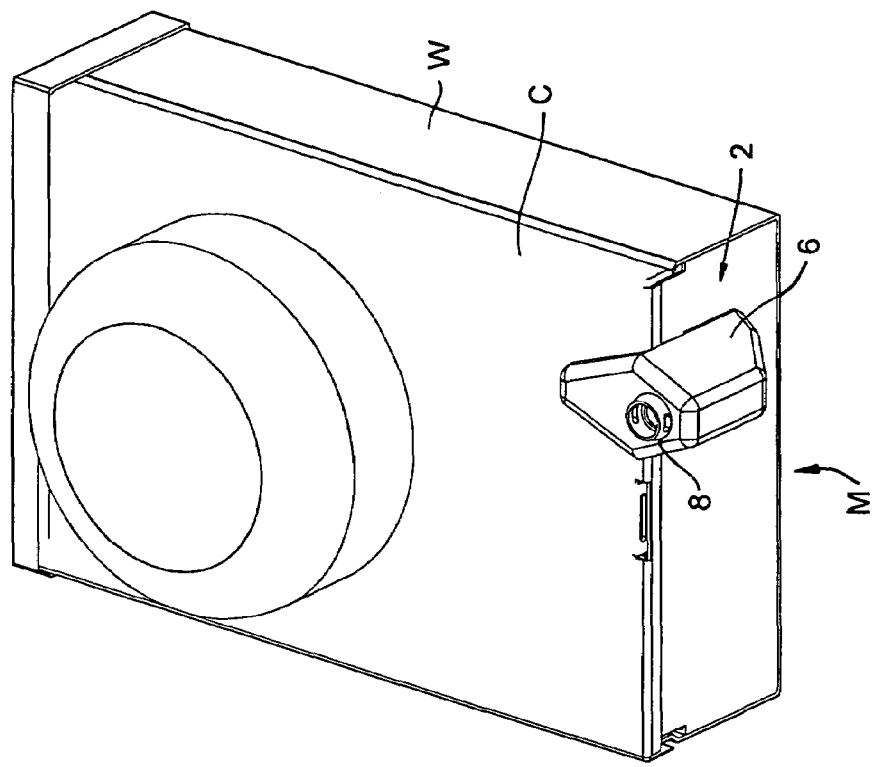
FIG. 23 is a perspective view showing the locking mechanism of FIG. 1A mounted on the bottom of a ringless meter box.

Turning now to FIGS. 20–23, it will be seen that the locking mechanism 2 can be respectively mounted at a minimum of two different locations on the meter box M. FIGS. 20–21 show a side mount arrangement in which the locking mechanism 2 is secured to a side wall portion W' of the meter box M. FIGS. 22–23 show a bottom mount arrangement in which the locking mechanism 2 is secured to a bottom wall portion W" of the meter box M. It should be noted that the latter installation will be aided by the tabs 62c and 62d of the locking member 10. In particular, as shown in FIG. 22, when the locking mechanism 2 is in the closed clamping position, the tabs 62c and 62d will extend upwardly toward the bottom of the lip or flange L on the wall W of the meter box M. Should an unauthorized person manage to somehow displace the locking mechanism 2 in an upward direction, the tabs 62c and 62d will come into contact with the lip or flange L, thereby preventing further dislodgment of the locking mechanism. A further advantage of the locking mechanism 2 with respect to the bottom mounting position of FIGS. 22–23 is that the throat portion 24 of the clip bracket 4, with its wide configuration, is able to easily span the distance of the lip or flange L.

2. Second Exemplary Embodiment

A second exemplary embodiment of the invention will now be described with reference to the locking mechanism 102 of FIGS. 24–36. As can be seen in the assembly views of FIGS. 24 and 25, the locking mechanism 102 includes a clip bracket 104, a protective outer lock body 106 with a spring-loaded plunger lock assembly 108, a locking member 110 integrally formed with a pivotable actuating lever 112, and a spacer 114. As described in more detail below, the clip bracket 104 is adapted to engage a wall W of a meter box M whose cover C is to be secured. The lock body 106 is adapted to latch to the clip bracket 104 and engage the box cover C. The locking member 110 and the actuating lever 112 are carried as a single integral pivoting member on the clip bracket 104. The actuating lever 112 is adapted to actuate the locking member 110 so as to clamp the clip bracket 104 to the box wall W upon closure of the box cover C.

In FIGS. 26–29, the clip bracket 104 is shown to be constructed as a singular body 120 made from a suitable metal, such as steel or the like. The body 120 is configured to provide an outer catch portion 122, an intermediate throat portion 124, and an inner lever-carrying portion 126. The catch portion 122 is adapted to engage a lateral opening of the lock body 106 (described below) and is preferably constructed with a tapered and chamfered end to facilitate guidance into the lock body. Additionally, the catch portion 122 has a through-hole 127 proximate to its tapered end. The through-hole 127 is adapted to receive the spring-loaded plunger lock assembly 108 for locking purposes. The throat portion 124 includes a central throat section 124a adapted to rest on (and span) the wall W of the box M during use, an outer throat section 124b adapted to lie outside the wall W of the box M, and an inner throat section 124c adapted to lie within the box M. The dimensions of the throat portion 124 can be varied, and are selected such that the clip bracket 104 may accommodate thin-walled boxes with box walls of different width and height. As discussed above, such walls may also have lips or flanges of various dimensions or they may be formed without lips or flanges. The lever-carrying portion 126 is constructed as a pair of slotted tabs 128 formed with pivot slots 129. As described in more detail below, the pivot slots 129 are adapted to seat the locking member 110, allowing the locking member 110 to pivot thereon.

As shown in FIG. 29, the clip bracket 104 can be formed from a single flat, stamped piece, and given its final configuration using a bending process. Other fabrication techniques, such as casting or molding, could also be used. During the bending process, the body 120 of the clip bracket 104 is bent at locations B101, B102, and B103 at approximately 90-degree angles, creating the catch portion 122 and the throat portion 124. Two additional bends B104 and B105 of approximately 90 degrees are formed to create the slotted tabs 128 that define the lever-carrying portion 126. Other bending configurations could also be used. For example, instead of a bend being approximately 90 degrees, two bends of approximately 45 degrees could be used, and so on.

The lock body 106 and the spring-loaded plunger assembly 108 are identical in construction to the lock body 6 and spring-loaded plunger assembly 8 of the first exemplary embodiment. As such, reference is made to the discussion above regarding these components and their operation.

Figure 33:
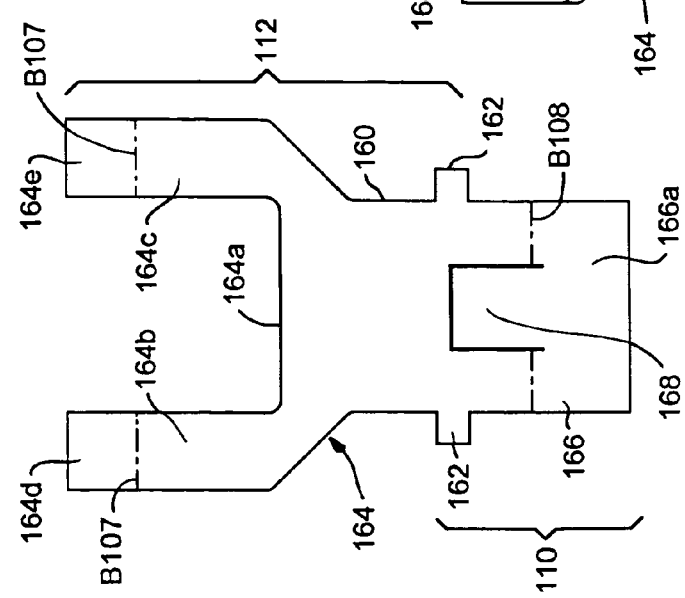
FIG. 33 is a plan view of a shaped work piece prior to forming into an integral actuating lever and locking member lever of the locking mechanism of FIG. 24.
Figure 32:
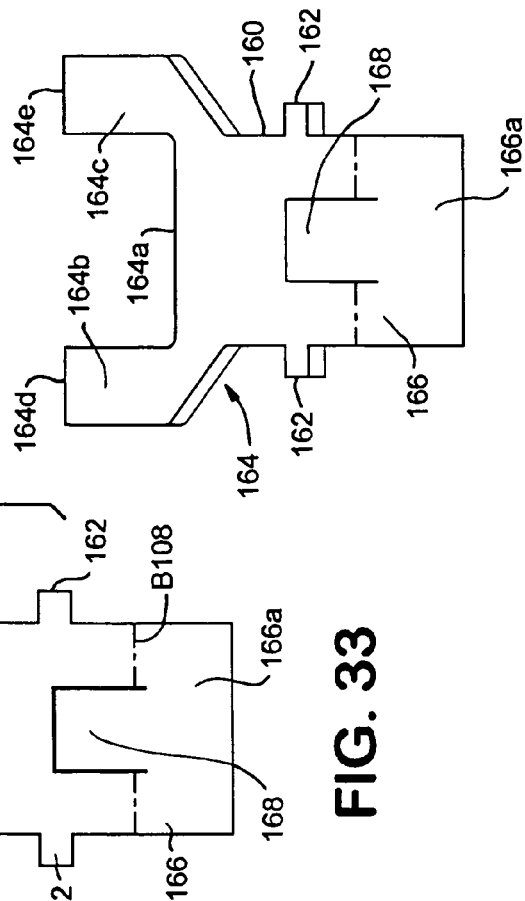
FIG. 32 is a front view of an integral actuating lever and locking member of the locking mechanism of FIG. 24.

In FIGS. 30–33, the locking member 110 and the integral actuating lever 112 are shown to be constructed as a singular body 160 made from a suitable metal, such as steel or the like. The body 160 is configured with two protruding support tabs 162 that provide a fulcrum or pivot point for both the locking member 110 and the actuating lever. The tabs 162 are sized to be pivotally received in the slots 129 of the clip bracket 104. As best shown in FIG. 33, the actuating lever 112 begins at the tabs 162 and extends to form a cover-engaging portion 164 of the body 160. The locking member 110 begins at the tabs 162 and extends to form a wall-engaging portion 166 of the body 160. The cover-engaging portion 164 divides at 164a into two arms 164b and 164c in order to avoid interference with the clip bracket 104. The arms 164b and 164c respectively terminate at cover contact pads 164d and 164e that are adapted to engage the box cover C. Note that instead of splitting the cover-engaging portion 164, other configurations could be used, such as a single arm adapted to extend around one side of the clip bracket 104 or through an opening (not shown) in the clip bracket. The wall-engaging portion 166 extends to a wall contact pad 166a that is adapted to engage the box wall W. A protruding locking tab 168 extends from the contact pad 166a, and is adapted to seat below the jog (shown at "J" in FIG. 25) that is typically present on the side walls of a meter box. When the locking member 110 is pivoted into its closed clamping position, the protruding locking tab 168 will be trapped by the jog J, thereby making unauthorized removal of the locking mechanism 102 more difficult.

As shown in FIG. 33, the locking member 110 and the integral actuating lever 112 can be formed from a single flat, stamped piece, and given their final configuration using a bending process. Other fabrication techniques, such as casting or molding, could also be used. During the bending process, the body 160 is bent at two locations, B107 and B108, at angles of approximately 45-degrees (or any other suitable angle) to create the above-described contact pads 164d, 164e and 166a. These contact pads are aligned such that they will concurrently contact the cover C and a side wall W of the closed meter box M. The locking tab 168 can be formed by separating and not bending a central portion of the body 160 at B108.

Figure 24:
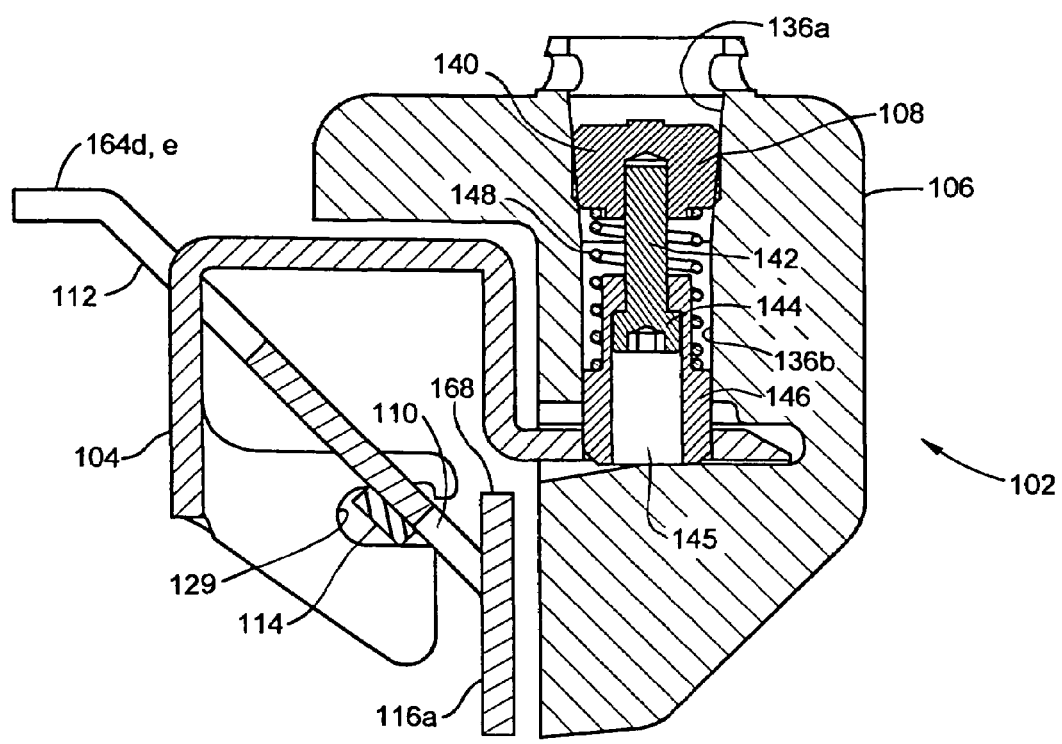
FIG. 24 is a cross-sectional assembly view showing a locking mechanism constructed in accordance with a second exemplary embodiment the invention, with a locking member thereof in a closed clamping position.
Figure 25:
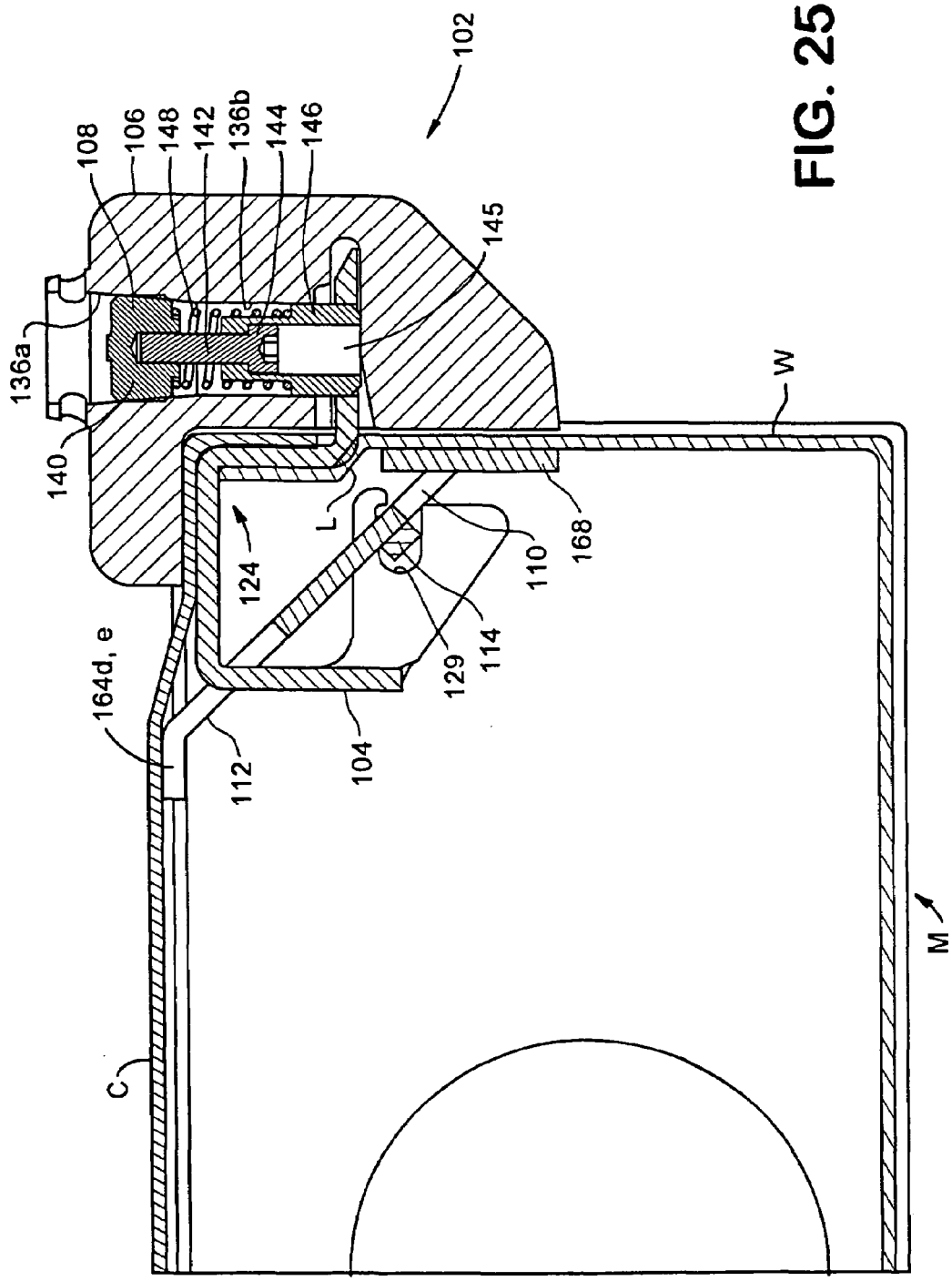
FIG. 25 is a cross-sectional view showing the locking mechanism of FIG. 24 mounted on a meter box.
Figure 30:
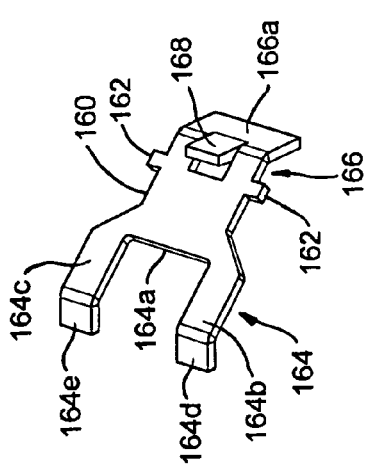
FIG. 30 is a perspective view of an integral actuating lever/locking member of the locking mechanism of FIG. 24.
Figure 31:
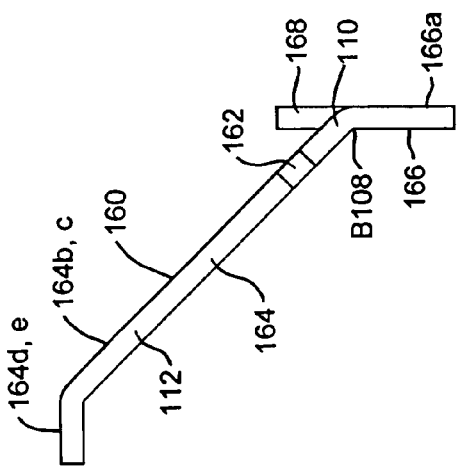
FIG. 31 is a side view of an integral actuating lever and locking member of the locking mechanism of FIG. 24.

As seen in FIGS. 24 and 25, the locking member 110 and the integral actuating lever 112 are pivotally mounted to the clip bracket 104 with the support tabs 162 resting in the pivot slots 129 of the clip bracket 104. The cover contact pads 164d and 164e of the actuating lever 112 will be located distally from the catch portion 122 of the clip bracket 104 for engagement with the box cover M. As stated, the wall contact pad 166a of the locking member 110 will be then be positioned for engagement with the box wall W.

Figure 34:
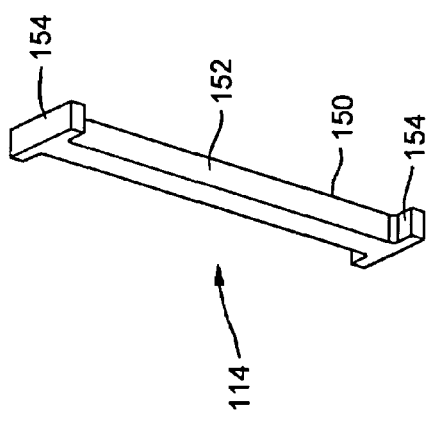
FIG. 34 is a perspective view of a spacer of the locking mechanism of FIG. 24.
Figure 35:
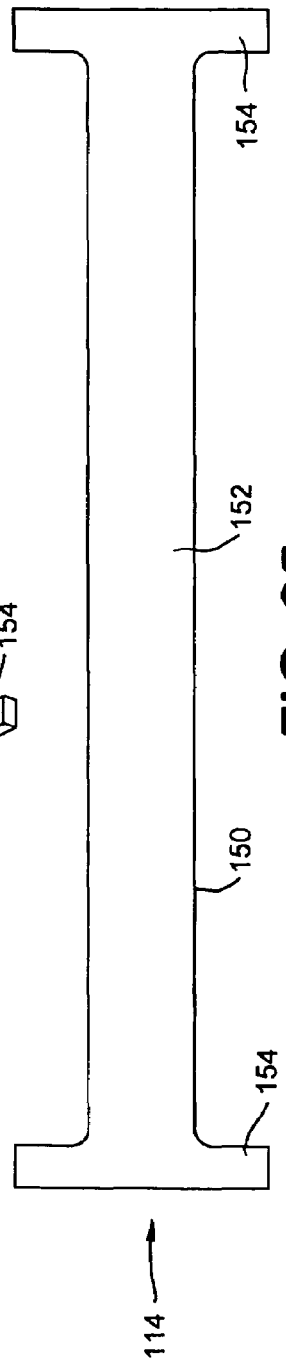
Figure 36:
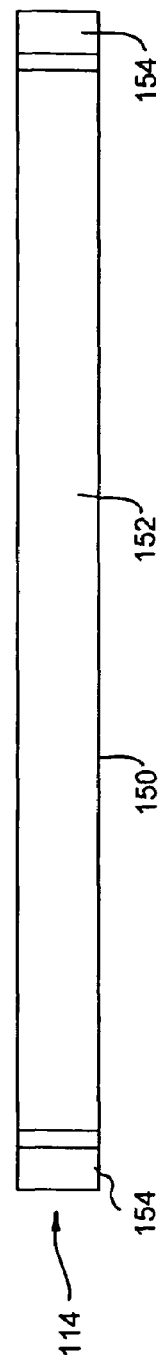

The spacer 114, as shown in FIGS. 34–36, is used to laterally position the locking member 110 relative to the wall W of the box M to accommodate different wall configurations. The spacer 114 can be constructed as a singular body 150 and is configured with a central spacing member 152 terminating at retaining tabs 154. The central spacing member 152 is adapted to seat in the pivot slots 129 on the lever-carrying portion 126 of the clip bracket 104, with the support tabs 162 of the locking member 110 and the actuating lever 112 seated thereon. The tabs 154 are adapted for holding the central spacing member 152 in the slots 129 by firmly engaging the outside of the slotted tabs 128 of the clip bracket 104. The spacer 114 can be made of any suitable material capable of positioning the locking member 110, such as plastic.

The installation and operation of the locking mechanism 102 are essentially the same as described above in connection with the first exemplary embodiment, the only difference being that no separate actuating lever manipulation step is required prior to closure of the box cover C. Instead, the actuating lever 112 actuates the locking member 110 into its closed clamping position as a result of closing the box cover C. In particular, as the cover C is closed, it contacts the cover contact pads 164*d* and 164*e* of the actuating lever 112, causing it to pivot. This action also pivots the locking member 110, forcing the wall contact pad 166*a* of the locking member against the wall W of the meter box M. It will also be seen that the spacer 114 allows the locking member 110 to be selectively laterally positioned to accommodate the different topologies of the side and bottom walls of the box M. In particular, the spacer 114 can be used when the locking mechanism 102 is mounted at a side wall location, and then removed when the locking mechanism 102 is mounted at a bottom wall location. Advantageously, the locking mechanism 102 can be mounted on the meter box M without having to place a hand inside the meter box.

It may also be desired to retain the locking mechanism 102 on a side wall portion of the meter box M when the meter box is installed in the standard vertical orientation. Insofar as there is no separately pivotable actuating lever (as in the first exemplary embodiment described above), an alternative retention scheme is needed. One possible solution would be to insert a suitable spring clip (not shown) within the U-shaped area of the clip bracket 104 formed by the throat sections 124*a*, 124*b* and 124*c*. The spring clip would be sized to engage a top portion of the side wall with sufficient force to maintain the locking mechanism in the installation position shown in FIG. 25.

Accordingly, a ringless meter lock for securing the cover of a thin-walled box to a box frame has been disclosed. While two exemplary locking mechanism embodiments of the invention have been shown and described, it should be apparent that many variations and alternative embodiments could be implemented in accordance with the teachings herein. For example, although a pivotable locking member is shown in both embodiments, other embodiments could be constructed using a locking member that is displaceable (e.g., slidable), but does not necessarily pivot. Various alternative configurations could also be provided for interengagement of the actuating lever to the locking member. For example, instead of the cam engagement scheme of the first exemplary embodiment or the integral engagement scheme of the second exemplary embodiment, a linkage engagement scheme might be used (e.g., using a four-bar linkage). It will also be appreciated that the clip bracket and the lock body could be formed into a variety of suitable configurations, depending on design preferences, and need not necessarily be configured in the manner shown in the drawing figures.

It is understood, therefore, that the invention is not to be in any way limited except in accordance with the spirit of the appended claims and their equivalents.

What is claimed is:

1. A locking mechanism for securing the cover of a thin-walled box to a box frame comprising:

a clip bracket adapted to engage a wall of said box frame;

a lock body adapted to latch to said clip bracket and engage said box cover;

a pivotally actuated clamping mechanism carried by said clip bracket and adapted to clamp said clip bracket to said box wall when said clamping mechanism is pivoted to a clamping position; and wherein said clamping mechanism includes a cover-engaging portion positioned to affirmatively engage and receive a clamping force from said cover following closure of said cover.

2. A locking mechanism in accordance with claim 1 wherein said clamping mechanism is configured to maintain itself in said clamping position without closure of said cover.

3. A locking mechanism in accordance with claim 1 wherein said clamping mechanism is adapted to be pivotally actuated into said clamping position by a human operator prior to closure of said cover.

4. A locking mechanism in accordance with claim 1 wherein said clamping mechanism includes a cover-engaging portion to be engaged by a human operator during pivotal actuation of said clamping mechanism to said clamping position and a wall-engaging portion.

5. A locking mechanism in accordance with claim 1 wherein said clamping mechanism comprises two pivoting members.

6. A locking mechanism in accordance with claim 1 wherein said clamping mechanism comprises a pivotable locking member adapted to engage said wall of said box frame and a pivotable actuating lever adapted to engage said cover and actuate said locking member into said engagement with said wall.

7. A locking mechanism in accordance with claim 6 wherein said actuating lever comprises a locking member-engaging portion.

8. A locking mechanism in accordance with claim 7 wherein said locking member-engaging portion comprises a cam configuration.

9. A locking mechanism in accordance with claim 8 wherein said cam configuration comprises a generally flat surface adapted for generally coplanar engagement with a generally flat surface of said locking member to thereby secure said locking member into said engagement with said wall irrespective of box frame orientation or box cover closure position.

10. A method for securing the cover of a thin-walled box to a box frame, comprising:

placing a clip bracket on a wall of said box frame, said clip bracket having a latch portion disposed outside of said box frame and a carrying portion disposed inside of said box frame carrying a pivotally actuated clamping mechanism adapted to clamp said clip bracket to said box wall when said clamping mechanism is pivoted to a clamping position;

closing said cover to affirmatively engage a cover-engaging portion of said clamping mechanism and pivot said clamping mechanism in clamping engagement with said box wall to secure said clip bracket to said box frame; and securing said cover by attaching a lock body to said clip bracket latch portion with said lock body in engagement with said cover.

11. A method in accordance with claim 10 wherein said clamping mechanism is configured to maintain itself in said clamping position without closure of said cover, said placing and pivoting are performed with said wall in a vertical orientation, and said clamping mechanism is not touched by a human operator following said pivoting.

12. A method in accordance with claim 10 wherein said clamping mechanism includes a cover-engaging portion to be engaged by a human operator and said cover-engaging portion is used to perform said pivoting of said clamping mechanism.

13. A locking mechanism for securing the cover of a thin-walled box to a box frame comprising:
   bracket means for engaging a wall of said box frame;
   lock means for latching said bracket means and engaging said box cover;
   pivotally actuated clamping means for clamping said bracket means to said box wall; and
   wherein said clamping means includes a cover-engaging portion positioned to affirmatively engage and receive a clamping force from said cover following closure of said cover.

14. A locking mechanism in accordance with claim 13 wherein said clamping means is configured to maintain itself in a clamping position without closure of said cover.

15. A locking mechanism in accordance with claim 13 wherein said clamping means is adapted to be pivotally actuated into a clamping position by a human operator prior to closure of said cover.

16. A locking mechanism in accordance with claim 13 wherein said clamping means includes a cover-engaging portion to be engaged by a human operator during pivotal actuation of said clamping means to a clamping position and a wall-engaging portion.

17. A locking mechanism in accordance with claim 13 wherein said clamping means comprises two pivoting members.

18. A locking mechanism in accordance with claim 13 wherein said clamping means comprises a pivotable locking member adapted to engage said wall of said box frame and a pivotable actuating lever adapted to engage said cover and actuate said locking member into said engagement with said wall.

19. A locking mechanism in accordance with claim 18 wherein said actuating lever comprises a locking member-engaging portion.

20. A locking mechanism in accordance with claim 19 wherein said locking member-engaging portion comprises a cam configuration.

21. A locking mechanism in accordance with claim 20 wherein said cam configuration comprises a generally flat surface adapted for generally coplanar engagement with a generally flat surface of said locking member to thereby secure said locking member into said engagement with said wall irrespective of box frame orientation or box cover closure position.

* * * * *